United States Patent [19]

Ahmed

[11] 4,223,280
[45] Sep. 16, 1980

[54] RELAXATION OSCILLATOR INCLUDING AN SCR AND HAVING SWITCH MEANS FOR INTERRUPTING CURRENT FLOW THERETHROUGH

[75] Inventor: Adel A. A. Ahmed, Clinton Township, Mercer County, N.J.

[73] Assignee: RCA Corporation, New York, N.Y.

[21] Appl. No.: 4,846

[22] Filed: Jan. 19, 1979

[51] Int. Cl.³ .................. H03K 3/82; H03K 3/352
[52] U.S. Cl. .................. 331/111; 307/252 R
[58] Field of Search .......... 331/107 R, 111, 143; 332/16 T, 14; 307/252 B, 252 F, 252 R

[56] References Cited

U.S. PATENT DOCUMENTS

| 3,737,731 | 6/1973 | Zeewy | 331/111 |
| 3,872,405 | 3/1975 | Gotou et al. | 331/111 |
| 3,911,377 | 10/1975 | Goodheart et al. | 331/111 |
| 4,001,723 | 1/1977 | Sheng et al. | 331/111 |

Primary Examiner—Siegfried H. Grimm
Attorney, Agent, or Firm—Paul J. Rasmussen; Allen LeRoy Limberg; John M. O'Meara

[57] ABSTRACT

Within a relaxation oscillator of the type having a capacitor that is recurrently being charged from a current source and discharged through a silicon controlled rectifier upon reaching a voltage threshold thereacross, a switch is disposed to interrupt current flow through the SCR in response to the capacitor being discharged to a predetermined level.

13 Claims, 2 Drawing Figures

RELAXATION OSCILLATOR INCLUDING AN SCR AND HAVING SWITCH MEANS FOR INTERRUPTING CURRENT FLOW THERETHROUGH

The present invention relates to an oscillator circuit of the type wherein a capacitor is recurrently charged from a current source and then discharged through a silicon controlled rectifier (SCR) upon reaching a threshold voltage thereacross.

Although relaxation oscillators of this type are well known in the art, such oscillators are operationally limited. The current source must supply the latching current required to render the SCR conductive so that the capacitor can be discharged. If the SCR is to become non-conductive after the capacitor has been discharged, however, the magnitude of the current source must not exceed the holding current requirement of the SCR. Generally, the difference in magnitude between the latching and holding currents of the SCR is not very great. Therefore, the magnitude of the current source is limited to a narrow range, particularly when allowance is made for tolerance to consider normal variations in the characteristics of the SCR. Consequently, the value of the capacitor is essentially selected in accordance with the oscillation frequency desired, rather than in accordance with other practical considerations. For example, at high operating frequencies it may be desirable to use a capacitor of sufficiently large value to swamp out the effects of stray capacitance. Where a resistor is connected from a supply rail to provide the current source, another problem is presented when little difference exists between the latching and holding currents of the SCR. This is so because the available voltage drop across the resistance is low when a large current is desired to render the SCR conductive but high when a small current is desired to render the SCR non-conductive. These conflicting conditions operate to restrict the permissible oscillation amplitude.

The relaxation oscillator of this invention overcomes this operational limitation by interrupting current flow through the SCR in response to the capacitor being discharged to a predetermined level. In one preferred embodiment, the current flow interruption is accomplished through a switching circuit which includes a bipolar transistor having its main conduction path disposed in series with the main conduction path of the SCR and means for supplying base current to the transistor during each oscillation cycle until the capacitor is discharged to the predetermined level.

Figure 1:
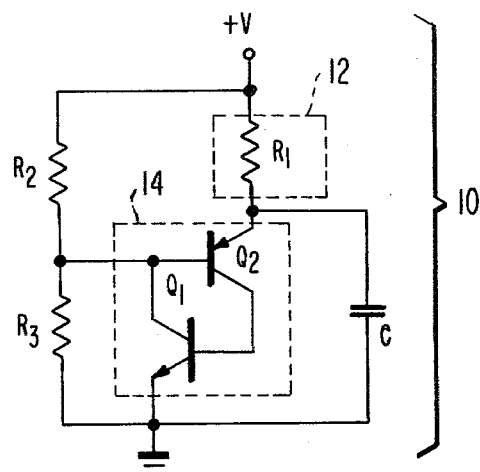
FIG. 1 is a schematic of a prior art relaxation oscillator.

The prior art relaxation oscillator 10 of FIG. 1 includes a capacitor C which is recurrently charged by a current source 12 and then discharged through an SCR 14 upon reaching a threshold voltage thereacross. Of course, the voltage across C is proportional to the level of charge stored therein as stated by Coulomb's Law. Resistor $R_1$ is connected from a rail voltage $+V$ as the current source 12, while bipolar transistors $Q_1$ and $Q_2$ of complementary types are connected in a conventional manner as the SCR 14. A voltage divider including resistors $R_2$ and $R_3$ is connected between $+V$ and a reference rail voltage such as ground to apply a bias voltage to the negative gate of the SCR 14 which is then commonly known as a programmable unijunction transistor or silicon controlled switch (see U.S. Pat. No. 4,001,723). Of course, the bias voltage could be applied to the positive gate of the SCR 14 at the base of $Q_1$ where a negative rail voltage is more convenient. Charge is supplied to C by the current source 12 until the voltage thereacross increases sufficiently to forward bias the base-emitter junction of $Q_2$, which functions as the gate control junction of the SCR 14. Then the latching current is drawn through the main conduction path of $Q_2$, so that $Q_1$ becomes sufficiently conductive to pull down the base of $Q_2$ and thereby establish the regenerative loop necessary to render the SCR 14 conductive across C. Thereafter C discharges until the current being drawn through the main conduction path of $Q_2$ falls below the holding level that is necessary to maintain conduction about the regenerative loop. Consequently, the SCR 14 becomes substantially non-conductive and charge is once again directed to C by the current source 12 to commence another oscillation cycle. The magnitude of the current source 12 is, of course, limited by the latching and holding current requirements of the SCR 14. Therefore, the frequency attainable from the relaxation oscillator 10 is substantially determined by the value of C which may present the difficulties discussed previously.

Figure 2:
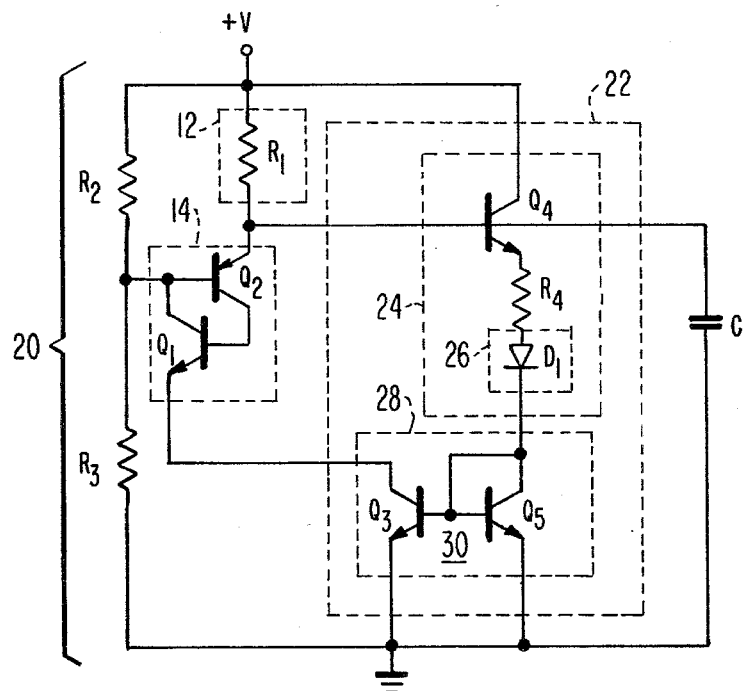
FIG. 2 is the block diagram for the relaxation oscillator of the invention, and also the schematic diagram for the preferred embodiments thereof.

The relaxation oscillator 20 of this invention is shown in the block diagram of FIG. 2 wherein the current source 12, the SCR 14, and the capacitor C from the relaxation oscillator 10 of FIG. 1 are utilized. A switch means 22 is disposed in relaxation oscillator 20 for interrupting current flow through the SCR 14 in response to C being discharged to a predetermined level during each oscillation cycle. Relaxation oscillator 20 operates in the same manner as the relaxation oscillator 10 of FIG. 1, except that current through the main conduction path of the SCR 14 is not reduced below the holding current level during each oscillation cycle but rather is interrupted when the predetermined discharge level of C is reached. Therefore, the magnitude of the current source 12 may be increased beyond the holding current magnitude to increase the oscillation frequency obtainable for any given value of C.

Although many embodiments of the switch means 22 are possible, FIG. 2 shows one preferred embodiment thereof which includes a bipolar transistor $Q_3$ having its main conduction path connected in series with the main conduction path of the SCR 14. A means 24 for supplying base current to $Q_3$ during each oscillation cycle until C discharges to the predetermined level, is also included in this embodiment. The relaxation oscillator 20 then operates with conduction through $Q_3$ being controlled by the base current supply means 24 to shut off the SCR 14 in response to the discharge level of C. During each oscillation cycle, C is initially charged by the current source 12 while the base current supply means 24 functions to forward bias the base-emitter junction of $Q_3$ and thereby connects the emitter of $Q_1$ to ground. When the gate control junction of SCR 14 becomes forward biased by the charge level on C, the main conduction path through SCR 14 is rendered conductive. Then C discharges to the predetermined level at which the base current supply means 24 responds to render $Q_3$ non-conductive and thereby interrupt current flow through the SCR 14 to commence another oscillation cycle.

The base current supply means 24 may also have many embodiments within the switch means 22, and FIG. 2 shows the preferred embodiments which include a bipolar transistor $Q_4$. The main conduction path of $Q_4$ is connected between $+V$ and the base of $Q_3$, while the voltage across C is applied to the base of $Q_4$. The base-emitter junctions of $Q_3$ and $Q_4$ are connected in series across C and are forward biased into conduction as C is being charged by the current source 12 during each oscillation cycle. The voltage level between $R_2$ and $R_3$ is fixed to also forward bias the gate control junction of the SCR 14 as C is being charged by the current source 12 during each oscillation cycle, but at a higher charge level than the forward biased level of $Q_3$ and $Q_4$. During each oscillation cycle therefore, charge is applied to C by the current source 12 and first reaches the level at which $Q_3$ and $Q_4$ are forward biased. C continues to charge to a higher magnitude at which the gate control junction of the SCR 14 is forward biased. Then C discharges through the main conduction path of the SCR 14 until the voltage thereacross is insufficient to sustain the forward bias across the base-emitter junctions of $Q_3$ and $Q_4$. Therefore, the SCR 14 is rendered nonconductive through the collector-emitter path of $Q_3$ and another oscillation cycle is commenced with charge being again applied to C.

The emitter of $Q_4$ could be connected directly to the base of $Q_3$, however, the voltage level attainable across C would then be limited to the sum of the forward-biased base-emitter junction voltages of $Q_3$ and $Q_4$ so that the possible range of oscillation frequencies would thereby be limited. Therefore, a resistor $R_4$ is disposed between the emitter of $Q_4$ and the base of $Q_3$ for limiting the flow of base current to $Q_3$ in accordance with the threshold voltage level of C that is necessary to obtain the desired oscillation frequency. Furthermore, those skilled in the art will realize without further explanation that the oscillation frequency is related to the fixed voltage level between $R_2$ and $R_3$ which could be made adjustable by including a potentiometer (not shown).

Where $Q_1$, $Q_2$, $Q_3$ and $Q_4$ are structured on a monolithic chip, C will be discharged through the main conduction paths of the SCR 14 and $Q_3$ until its charge level falls below the sum of the forward-biased base-emitter junction voltages of $Q_3$ and $Q_4$. However, where these transistors are not structured of the same semiconductor material, the forward drop across the main conduction paths of the SCR 14 and $Q_3$ may be sufficient to preclude that charge level from falling below the total forward-biased base-emitter junction voltage of $Q_3$ and $Q_4$. In this situation, a means 26 for offsetting the voltage between the main conduction path of $Q_4$ and the base of $Q_3$ may be included in the circuitry of FIG. 2 to raise the predetermined level to which C must be discharged in rendering $Q_3$ and $Q_4$ non-conductive.

A diode $D_1$ is connected between the main conduction path of $Q_4$ and the base of $Q_3$ as the voltage offsetting means 28 in the circuitry of FIG. 2. However, other circuit components such as zener diodes or avalanche diodes could be utilized separately or combined with $D_1$ in the voltage offsetting means 26 for deriving the predetermined level to which C will be discharged.

Since C is both charged and discharged during each frequency cycle of the oscillator 20, the charge rate of C as determined by the magnitude of the current source 12 may be fixed and means 28 for controlling the discharge rate of C may be incorporated into the switch means 22 to determine the oscillation frequency. In one preferred embodiment of the discharge rate control means 28, a bipolar transistor $Q_5$ is combined with $Q_3$ in a current mirror amplifier (CMA) 30, as shown in FIG. 2. $Q_5$ is disposed in the master path of CMA 30 with its main conduction path connected between the emitter of $Q_4$ and ground. The discharge path of C through $Q_3$ is disposed in the slave path of CMA 30 and the base electrodes of $Q_3$ and $Q_5$ are commonly connected to the $Q_4$ side of the main conduction path through $Q_5$. As is well known in the art, current flow through the slave path is directly proportional to current flow through the master path in the CMA 30. Consequently, the discharge rate of C through the main conduction path of $Q_3$ is proportional to the current flow through the main conduction path of $Q_5$. Therefore, by controlling the level of current flow through $Q_5$, such as with a resistor similar to $R_4$ in the base current supply means 24, the discharge rate of C is controlled.

Although this invention has been disclosed herein by describing only a few embodiments thereof, it should be understood by those skilled in the art that numerous changes in the details of construction and the combination or arrangement of parts could be made on the described embodiments without departing from the true scope and spirit of the invention. Therefore, the present disclosure should be construed as illustrative rather than limiting.

What I claim is:

1. In a relaxation oscillator of the type wherein
   a capacitor has a first plate connected to a reference potential and has a second plate connected to a voltage rail by a current source and;
   the main conduction path of an SCR is connected across the capacitor, which capacitor is recurrently charged by the current source and then discharged through the SCR upon the voltage at the second plate of the capacitor reaching a threshold level, the improvement comprising:
   switch means serially connected with the main conduction path of the SCR for interrupting current flow therethrough responsive to the voltage at the second plate of the capacitor being discharged to a predetermined level during each oscillation cycle.

2. The relaxation oscillator of claim 1 wherein said switch means includes:
   a first bipolar transistor having its main conduction path connected in series with the main conduction path of the SCR, and
   means responsive to the voltage at the second plate of the capacitor for supplying current to the base electrode of said first bipolar transistor during each oscillation cycle until the capacitor is discharged to make the voltage at the second plate thereof reach said predetermined level.

3. The relaxation oscillator of claim 2 wherein said means for supplying current includes:
   a second bipolar transistor having its main conduction path connected between the voltage rail and the base electrode of said first bipolar transistor and having the voltage at the second plate of the capacitor applied to its base electrode;
   said second bipolar transistor being rendered conductive to supply current to the base electrode of said first bipolar transistor as the voltage at the second plate of the capacitor approaches the threshold level, and being rendered non-conductive to terminate conduction through said first bipolar transistor when the voltage at the second plate of the capacitor reaches said predetermined level.

4. The relaxation oscillator of claim 3 wherein the main conduction path of said second bipolar transistor is connected to the base electrode of said first bipolar transistor through a resistor for limiting the flow of current to the base electrode of said first bipolar transistor and thereby increase the threshold level attainable across the capacitor.

5. The relaxation oscillator of claim 3 further including means connected between the main conduction path of said second bipolar transistor and the base electrode of said first bipolar transistor for offsetting the voltage therebetween to raise said predetermined level to which the voltage on the second plate of the capacitor must be discharged to render said first and second bipolar transistors non-conductive.

6. The relaxation oscillator of claim 5 wherein said means for offsetting the voltage includes diode means.

7. The relaxation oscillator of claim 1 wherein said switch means includes means for controlling the current flow therethrough for determining the discharge rate of the capacitor to thereby determine the oscillation frequency.

8. The relaxation oscillator of claim 7 wherein said switch means including means for controlling the current therethrough further includes:
   current mirror amplifying means having a master path between its input and common connections and having a slave path between its output and common connections, said slave path being serially connected with the main conduction path of the SCR; and
   means responsive to the voltage at the second plate of the capacitor for supplying current to the input connection of said current mirror amplifying means.

9. The relaxation oscillator of claim 8 wherein said current mirror amplifying means includes
   a transistor included in said slave path and having its main conduction path connected between the output and common connections of said current mirror amplifying means and having its base electrode connected to the input connection of said current mirror amplifying means; and
   diode means included in said master path and connected between the input and common connections of said current mirror amplifying means.

10. The relaxation oscillator of claim 8 wherein said means for supplying current includes
    a transistor having its main conduction path connected between the voltage rail and the input connection of said current mirror amplifying means, and having the voltage at the second plate of the capacitor applied to its base electrode.

11. The relaxation oscillator of claim 10 wherein resistance means is interposed between the main conduction path of said transistor and the input connection of said current mirror amplifying means.

12. The relaxation oscillator of claim 10 wherein means for offsetting voltage is interposed between the main conduction path of said transistor and the input connection of said current mirror amplifying means.

13. The relaxation oscillator of claim 12 wherein said means for offsetting voltage includes diode means.

* * * * *